US012077111B2

(12) United States Patent
Yamada et al.

(10) Patent No.: US 12,077,111 B2
(45) Date of Patent: Sep. 3, 2024

(54) IN-VEHICLE POWER SUPPLY STRUCTURE (71) Applicant: Mazda Motor Corporation, Hiroshima (JP)

(72) Inventors: Sadahisa Yamada, Hiroshima (JP); Yoshimasa Kurokawa, Hiroshima (JP); Tetsuhiro Yamashita, Hiroshima (JP); Masaaki Shimizu, Hiroshima (JP)

(73) Assignee: MAZDA MOTOR CORPORATION, Hiroshima (JP)

(*) Notice: Subject to any disclaimer, the term of this patent is extended or adjusted under 35 U.S.C. 154(b) by 307 days.

(21) Appl. No.: 17/623,624

(22) PCT Filed: Jul. 8, 2020

(86) PCT No.: PCT/JP2020/026690
§ 371 (c)(1),
(2) Date: May 26, 2022

(87) PCT Pub. No.: WO2021/010253
PCT Pub. Date: Jan. 21, 2021

(65) Prior Publication Data
US 2022/0289128 A1  Sep. 15, 2022

(30) Foreign Application Priority Data
Jul. 18, 2019  (JP) .................. 2019-133117

(51) Int. Cl.
B60R 16/03  (2006.01)
B60R 16/02  (2006.01)
(Continued)

(52) U.S. Cl.
CPC .......... *B60R 16/03* (2013.01); *B60R 16/0215* (2013.01); *G01R 31/50* (2020.01); *H01B 7/32* (2013.01)

(58) Field of Classification Search
CPC ............ B60R 16/03; G01R 31/50; H01B 7/32
See application file for complete search history.

(56) References Cited

U.S. PATENT DOCUMENTS

| 5,818,673 A | 10/1998 | Matsumaru et al. |
| 2019/0168693 A1* | 6/2019 | Nakamura .......... B60R 16/0238 |
| 2022/0381809 A1* | 12/2022 | Yamada ............... G01R 31/085 |

FOREIGN PATENT DOCUMENTS

| JP | 2001-314026 A | 11/2001 |
| JP | 2002-173881 A | 6/2002 |

(Continued)

OTHER PUBLICATIONS

International Search Report and Written Opinion mailed on Sep. 8, 2020, received for PCT Application PCT/JP2020/026690, Filed on Jul. 8, 2020, 8 pages including English Translation.

*Primary Examiner* — Paresh Patel
(74) *Attorney, Agent, or Firm* — XSENSUS LLP (57) ABSTRACT An in-vehicle power supply structure, in which a vehicle is divided into a plurality of zones and a power supply hub for connecting an electronic device is provided in each of the zones, includes a break detection wire routed along a power supply wire, for detecting damage to the power supply wire caused by an external force acting on the vehicle by its own damage. Both ends of the break detection wire are connected to power supply hubs placed adjacent to each other.

3 Claims, 6 Drawing Sheets (51) Int. Cl.
*G01R 31/50* (2020.01)
*H01B 7/32* (2006.01)

(56) References Cited

FOREIGN PATENT DOCUMENTS

| | | |
|---|---|---|
| JP | 2016-201740 A | 12/2016 |
| JP | 2019-98783 A | 6/2019 |
| JP | 2019-102305 A | 6/2019 |

* cited by examiner

IN-VEHICLE POWER SUPPLY STRUCTURE

CROSS-REFERENCE TO RELATED APPLICATIONS

The present application is based on PCT filing PCT/JP2020/026690, filed Jul. 8, 2020, which claims priority to JP 2019-133117, filed Jul. 18, 2019, the entire contents of each are incorporated herein by reference.

TECHNICAL FIELD

The technology disclosed herein belongs to a technological field related to an in-vehicle power supply structure in which power supply hubs are connected through a power supply wire.

BACKGROUND ART

In recent years, motorization of in-vehicle equipment is prominent: a number of electronic devices are placed in a vehicle. With this situation, the configuration of power supply to such electronic devices has been examined.

For example, Patent Document 1 discloses an in-vehicle communication system in which a gateway ECU for relaying communications between ECUs in different networks is provided, and only a network including a target ECU to which sending is to be started first after all networks go into sleep mode is waken up.

Patent Document 2 discloses a technology of connecting, in a ring, power supply wires that connect a battery and loads mounted in a vehicle.

CITATION LIST

Patent Document

PATENT DOCUMENT 1: Japanese Unexamined Patent Publication No. 2016-201740
PATENT DOCUMENT 2: Japanese Unexamined Patent Publication No. 2019-98783

SUMMARY OF THE INVENTION

Technical Problem

Power supply wires for in-vehicle equipment are presently routed radially from a power source (e.g., a relay box) so as to be roughly in line with communication harnesses. Also, various sensors such as cameras and radars are placed on the periphery of a vehicle to realize monitoring of the surroundings of the vehicle and automatic driving. As a result, the configuration of the power system becomes complicated, and the total length of the power supply wires becomes very large, causing a possibility of increasing the power consumption itself due to an influence of the power feed line resistance, etc.

Figure 3:
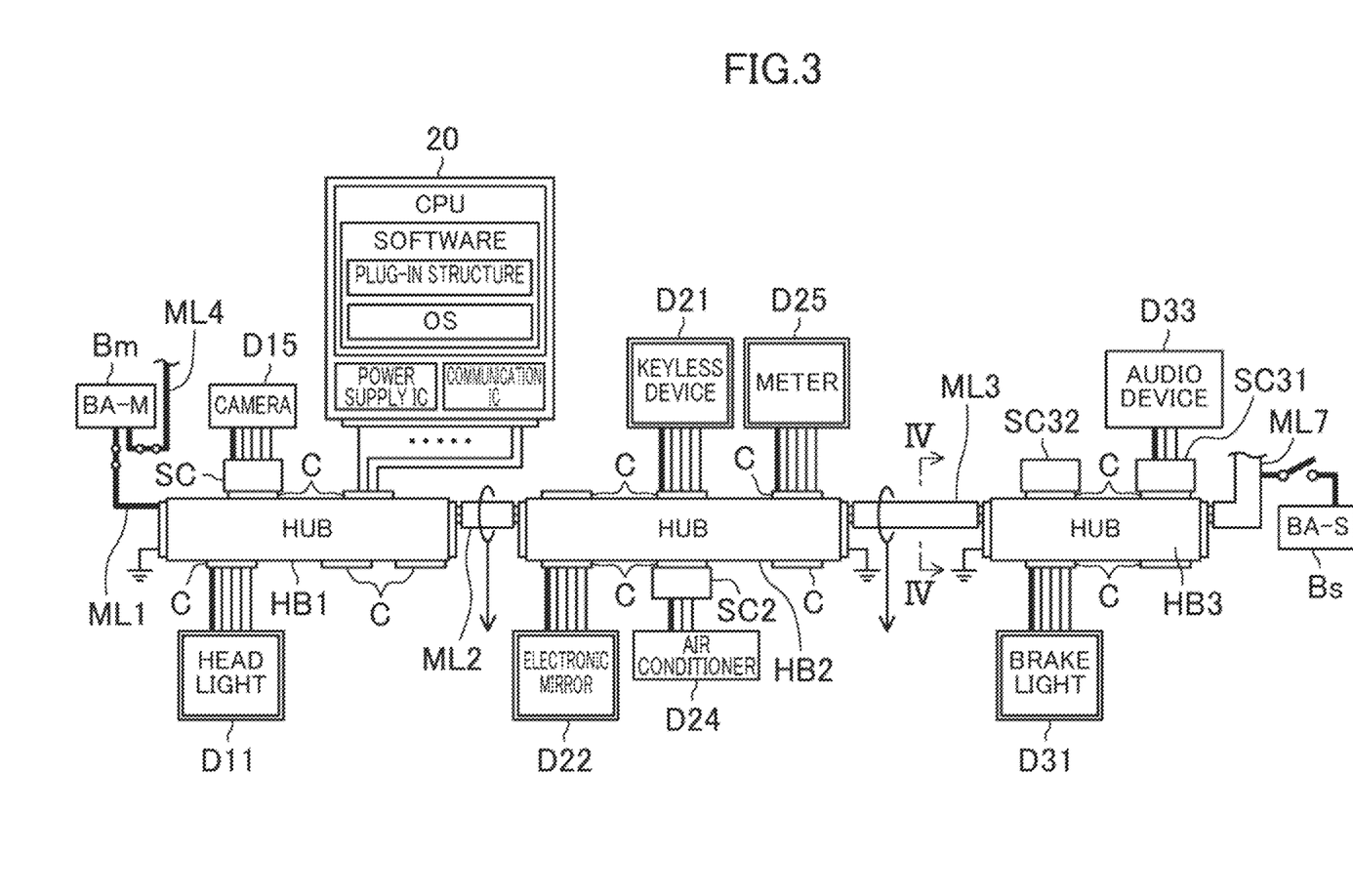
FIG. 3 is a conceptual view showing a configuration example of connection between electrical components and power supply hubs.

To solve the above problem, there is a method in which a ring-shaped power supply wire is provided to extend around a vehicle as viewed in plan, and power supply hubs are provided on this power supply wire at predetermined spacings, as exemplified in FIG. 3 of Patent Document 2. An actuator is connected to each of the power supply hubs. In this way, by supplying power to the actuators through the power supply hubs, the total length of power supply wires can be drastically shortened.

By connecting power supply wires in a ring, however, there arises an issue about the means for shutting off the current in case that a portion of the wires in a ring has broken.

In consideration of the above issue, an objective of the technology disclosed herein is detecting, more reliably, the presence of a break or the presence of a possibility of a break in power supply wires that connect power supply hubs.

Solution to the Problem

To solve the above problem, according to the technology disclosed herein, an in-vehicle power supply structure, in which a vehicle is divided into a plurality of zones, a power supply hub for connecting an electronic device is provided in each of the zones, and the power supply hubs are connected through power supply wires, includes: a break detection wire routed along the power supply wires, for detecting damage to the power supply wires caused by an external force acting on the vehicle by its own damage, wherein the break detection wire is configured to connect the power supply hubs placed adjacent to each other.

According to the above configuration, the break detection wire routed along the power supply wires is configured to connect the power supply hubs placed adjacent to each other. It is therefore possible to detect in which segment between the power supply hubs the break has occurred or there is a possibility of a break more reliably.

For example, in the case of providing a power supply shutoff mechanism in each power supply hub, power supply to the power supply wire in the break segment is shut off by the power supply hubs located on both sides of the break point, to separate the break segment from the other.

In the in-vehicle power supply structure described above, the break detection wire may be provided along a ring-shaped power supply wire formed by connecting the power supply wires in a ring.

With the above configuration, even in the ring-shaped power supply wire, in which a break point cannot be localized with fuses, the position where a break has occurred, or the position where there is a possibility of a break, can be detected.

In the in-vehicle power supply structure described above, the break detection wire may be formed to be more brittle than the power supply wires.

With the above configuration, since the break detection wire is more brittle, i.e., more susceptible to cutting than the power supply wires, the position having a possibility of a break can be detected more reliably.

Advantages of the Invention

As described above, according to the technology disclosed herein, with the exclusive break detection wire for detecting a break point provided along a power supply wire, the position where a break has occurred, or the position where there is a possibility of a break, can be detected more reliably.

DESCRIPTION OF EMBODIMENTS

Illustrative embodiments will be described hereinafter with reference to the accompanying drawings.

Embodiment 1

Figure 1:
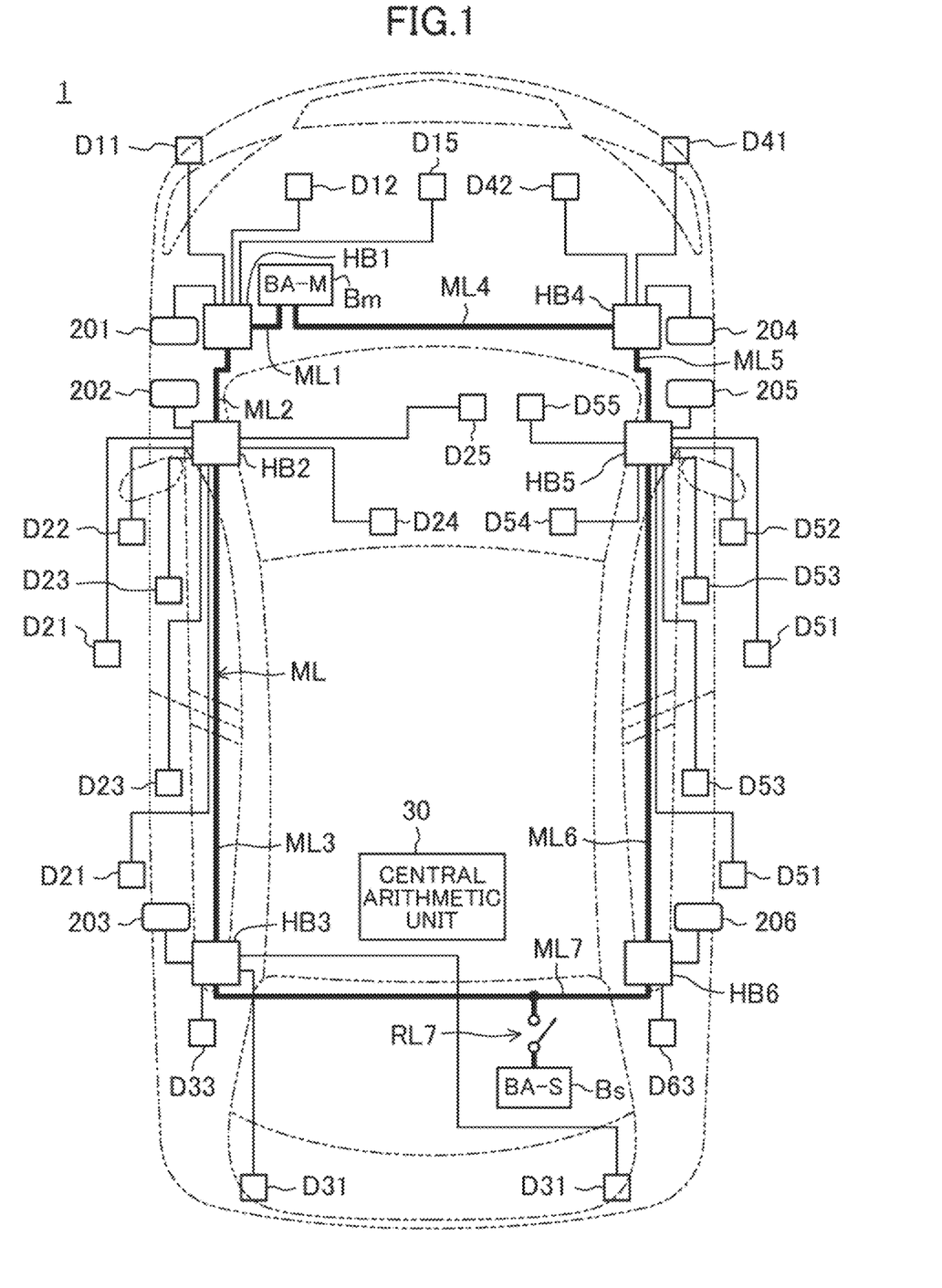
FIG. 1 shows a configuration of a power system for a vehicle in which an in-vehicle network according to Embodiment 1 is mounted.

FIG. 1 shows a power system of a vehicle 1 in which an in-vehicle network according to Embodiment 1 is mounted. The vehicle 1 is a 5-door vehicle having four side doors and one hatch.

In the power system in Embodiment 1, the vehicle 1 is divided into a plurality of zones (six zones in Embodiment 1), each of which is provided with a power supply hub HB for connecting electronic devices D. In the following description, the power supply hub HB placed in a left front zone located left in the front of the vehicle 1 is called a first power supply hub HB1, the power supply hub HB placed in a left side zone located near the left front side door of the vehicle 1 is called a second power supply hub HB2, and the power supply hub HB placed in a left rear zone located left in the rear of the vehicle 1 is called a third power supply hub HB3, in some cases. Likewise, the power supply hub HB placed in a right front zone located right in the front of the vehicle 1 is called a fourth power supply hub HB4, the power supply hub HB placed in a right side zone located near the right front side door of the vehicle 1 is called a fifth power supply hub HB5, and the power supply hub HB placed in a right rear zone located right in the rear of the vehicle 1 is called a sixth power supply hub HB6, in some cases. When the power supply hubs HB1 to HB6 are referred to with no distinction among them, they are simply called the power supply hubs HB. Note that, when the number of zones is increased or decreased, the number of power supply hubs HB will be increased or decreased accordingly.

The power supply hubs HB are placed on the way of a power supply route between a main battery Bm (indicated as BA-M in the figure) and the electronic devices D. Each of the power supply hubs HB is connected with the main battery Bm or a nearby power supply hub HB through a single main power feed line ML. Specifically, the first power supply hub HB1 is connected with the main battery Bm through a main power feed line ML1. The second power supply hub HB2 is connected with the first power supply hub HB1 through a main power feed line ML2. The third power supply hub HB3 is connected with the second power supply hub HB2 through a main power feed line ML3. The fourth power supply hub HB4 is connected with the main battery Bm through a main power feed line ML4. The fifth power supply hub HB5 is connected with the fourth power supply hub HB4 through a main power feed line ML5. The sixth power supply hub HB6 is connected with the fifth power supply hub HB5 through a main power feed line ML6. Also, the third power supply hub HB3 and the sixth power supply hub HB6 are mutually connected through a main power feed line ML7. In this way, a ring-shaped power supply route extending around the vehicle as viewed in plan is formed by the main battery Bm and the power supply hubs HB1 to HB6. With this, power supplied from the main battery Bm is supplied to the power supply hubs HB through the main power feed lines ML, and then supplied from the power supply hubs HB to the electronic devices D. The main power feed lines ML are an example of the ring-shaped power supply wire. The configuration of the power supply wires constituting the main power feed lines ML is not particularly limited. For example, so-called power supply hard wires are used.

Further, a spare battery Bs (indicated as BA-S in the figure) for supplying power in cases such as when power supply from the main battery Bm stops is connected to the main power feed lines ML at a position apart from the main battery Bm. The spare battery Bs is connected to the main power feed lines ML via a semiconductor relay RL7, and this connection to the main power feed lines ML is cut off during normal operation. In the example in FIG. 1, while the main battery Bm is connected between the main power feed line ML1 and the main power feed line ML4 in the front of the battery, the spare battery Bs is connected with the main power feed line ML7 in the rear of the vehicle. By placing the main battery Bm and the spare battery Bs apart from each other as in this example, the resistance to breaking can be enhanced. Note however that the placement of the main battery Bm and the spare battery Bs is not limited to the configuration of FIG. 1.

The electronic devices D include electronic devices to which power can be supplied from the main battery Bm at all times and electronic devices to which power supply from the main battery Bm is permitted through an operation by an occupant of the vehicle 1. In the following description, an electronic device to which power can be supplied from a battery at all times is called an all-time power supply electronic device D. An electronic device to which power supply from the main battery Bm is permitted through an operation by an occupant of the vehicle 1 and of which power consumption is comparatively small is called an accessory electronic device D. Also, an electronic device to which power supply from the main battery Bm is permitted through an operation by an occupant of the vehicle 1 and of which power consumption is comparatively large is called an ignition electronic device D. When the above electronic devices D are referred to with no distinction among them, they are simply called the electronic devices D.

The all-time power supply electronic devices D include, for example, keyless devices D21 and D51, a front monitoring camera device D15, burglar monitoring camera devices D12 and D42, a meter D25, a burglar alarm device D54, and brake lights D31. The accessory electronic devices D, which are electronic devices assumed to be used irrespective of ON/OFF of the engine of the vehicle 1, include, for example, head lights D11 and D41, electronic mirrors D22 and D52, and audio devices D33 and D63. The ignition electronic devices D, which are electronic devices basically assumed to be used when the engine of the vehicle 1 is ON although it can also be used when the engine is OFF, include, for example, an air conditioner D24, an electric power steering device D55, and electric power windows D23 and D53. Note that the electronic devices D refer to a concept including sensors, actuators, ECUs for controlling the actuators, etc., for actuating the above devices.

Power from the main battery Bm is supplied to each of the power supply hubs HB basically through a shorter power supply route. In cases such as when a portion of the main power feed lines ML has broken, however, power is supplied through another power supply route. For example, power is basically supplied to the second power supply hub HB2 from the main battery Bm via the first power supply hub HB1. When the main power feed line between the first power supply hub HB1 and the second power supply hub HB2 has broken, however, power is supplied from the main battery Bm via the fourth power supply hub HB4, the fifth power supply hub HB5, the sixth power supply hub HB6, and the third power supply hub HB3.

Each of the power supply hubs HB is placed near any of the all-time power supply electronic devices D1 in the vehicle 1. The power supply hubs HB is connected with any of the all-time power supply electronic devices D1, the accessory electronic devices D2, and the ignition electronic devices D3 located nearby through power feed lines.

The main power feed lines ML and the power feed lines connecting the electronic devices with the main power feed lines ML can be any electric lines as far as the lines can supply power therethrough. For example, they are constituted by wire harnesses.

Each of the power supply hubs HB is connected with a zone ECU 20 provided for each zone. Specifically, a zone ECU 201 is connected to the power supply hub HB1, a zone ECU 202 is connected to the power supply hub HB2, a zone ECU 203 is connected to the power supply hub HB3, a zone ECU 204 is connected to the power supply hub HB4, a zone ECU 205 is connected to the power supply hub HB5, and a zone ECU 206 is connected to the power supply hub HB6. When the zone ECUs 201 to 206 are referred to with no distinction among them, they are simply called the zone ECUs 20.

The zone ECUs 20 are each configured to receive a control signal from a central arithmetic unit 30 that controls the entire of the vehicle 1. The central arithmetic unit 30 and the zone ECUs 20 are mutually connected through communication wiring (not shown).

The central arithmetic unit 30 sets electronic devices D to be actuated according to the scene of the vehicle 1. Receiving a control signal from the central arithmetic unit 30, the zone ECUs 20 each output a control signal related to supply/shutoff of power to the electronic devices D to the corresponding power supply hub HB (strictly speaking, to a controller of a power supply IC to be described later). The zone ECUs 20 also have a function of managing and controlling the electronic devices D. For example, the zone ECUs 20 receive detection results from various sensors (such as a vehicle speed sensor and a vehicle interior temperature sensor) to use them for processing inside the units or send information to the central arithmetic unit 30.

Figure 2:
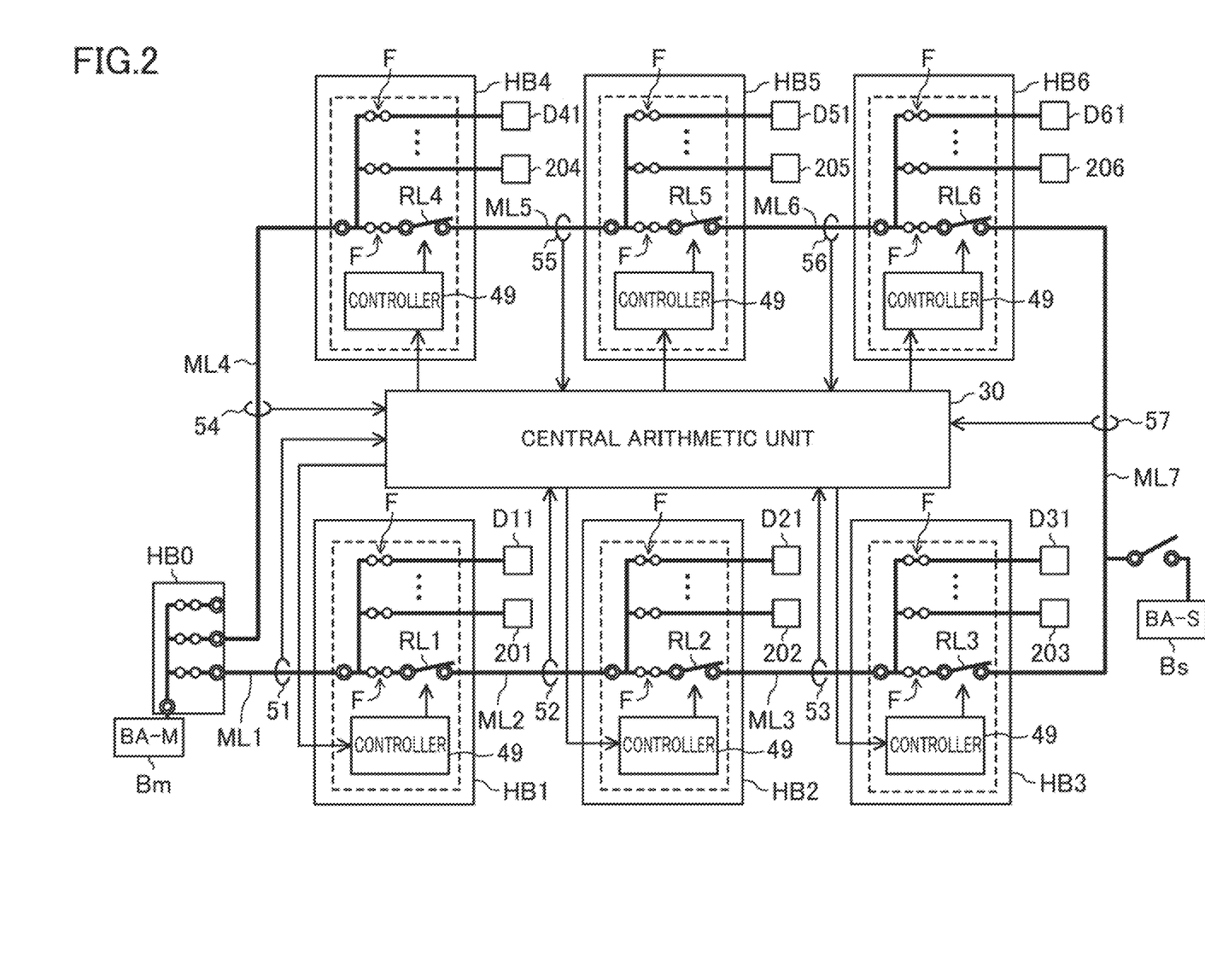
FIG. 2 is a block diagram showing an example of power supply topology for a vehicle according to Embodiment 1.

FIG. 2 is a block diagram showing an example of power supply topology of the vehicle. As shown in FIG. 2, a power supply hub HB0 is provided between the main battery Bm and the main power feed lines ML1 and ML4.

A power supply IC 4 is incorporated in each of the power supply hubs HB. The power supply ICs 4 are electrically connected with the main battery Bm through the main power feed lines ML. Specifically, a power supply IC 41 is incorporated in the power supply hub HB1, a power supply IC 42 is incorporated in the power supply hub HB2, a power supply IC 43 is incorporated in the power supply hub HB3, a power supply IC 44 is incorporated in the power supply hub HB4, a power supply IC 45 is incorporated in the power supply hub HB5, and a power supply IC 46 is incorporated in the power supply hub HB6. When the power supply ICs 41 to 46 are referred to with no distinction among them, they are simply called the power supply ICs 4. Power supplied from the main battery Bm is supplied, via the power supply ICs 4, to the electronic devices D connected to the power supply ICs 4.

The power supply ICs 4 each include a semiconductor relay RL provided on the main power feed lines ML for performing conduction/shutoff of power. Specifically, the power supply IC 41 includes a semiconductor relay RL1 provided between the main power feed line ML1 and the main power feed line ML2. The power supply IC 42 includes a semiconductor relay RL2 provided between the main power feed line ML2 and the main power feed line ML3. The power supply IC 43 includes a semiconductor relay RL3 provided between the main power feed line ML3 and the main power feed line ML7. The power supply IC 44 includes a semiconductor relay RL4 provided between the main power feed line ML4 and the main power feed line ML5. The power supply IC 45 includes a semiconductor relay RL5 provided between the main power feed line ML5 and the main power feed line ML6. The power supply IC 46 includes a semiconductor relay RL6 provided between the main power feed line ML6 and the main power feed line ML7. Also, the power supply ICs 4 each include a controller 49 that, receiving a control signal from the zone ECU 20, for setting supply/shutoff of power to the electronic devices D, controls connection (ON)/disconnection (OFF) of the electronic devices D to the power source. Note that, although the same reference character 49 is given to the controllers of the power supply ICs 41 to 46 for the sake of convenience, this does not necessarily mean that the controllers 49 of the power supply ICs 41 to 46 have the same configuration, but the controllers 49 may have different configurations from one another.

As shown in FIG. 2, a detector 5 is provided on each of the main power feed lines ML for detecting an electrical change due to a break. The specific configuration of the detector 5 is not particularly limited as far as the detector 5 can detect an electrical change caused by a break. Examples of the detector 5 include an ammeter for measuring the current flowing to the main power feed line ML, a voltmeter for measuring the voltage at the main power feed line ML, and a measuring coil for measuring the magnetic flux near the main power feed line ML. For example, in the case of using an ammeter as the detector 5, the current will stop if the main power feed line ML becomes an open state due to a break, or will sharply increase if the main power feed line ML becomes an short-circuited state due to a break. By monitoring a change in current, therefore, a break in the main power feed line ML can be detected. Similar changes also occur for the voltage and the magnetic flux, and therefore by monitoring a change in measured value, a break in the main power feed line ML can be detected.

The detectors 5 are provided at positions apart from one another on the main power feed lines ML. Specifically, the detectors 5 are provided between the adjacent relays. FIG. 2 shows an example of providing the detectors 5 on the main power feed lines ML: a detector 51 is provided on the main power feed line ML1, a detector 52 is on the main power feed line ML2, a detector 53 is on the main power feed line ML3, a detector 54 is on the main power feed line ML4, a detector 55 is on the main power feed line ML5, a detector 56 is on the main power feed line ML6, and a detector 57 is on the main power feed line ML7. The detectors 51 to 57 may have the same configuration or different configurations from one another. Also, the detectors 51 to 57 each may be a single sensor, or a combination of a plurality of sensors so that a plurality of kinds of parameters (e.g., the current, the voltage, and the magnetic flux) can be measured. When the detectors 51 to 57 are referred to with no distinction among them, they are simply called the detectors 5.

The positions where to place the semiconductor relays RL and the detectors 5 are not particularly limited. However, when there are a plurality of components implementing similar functions to secure the redundancy of functions, etc., they are placed so that power supply to these components will not be shut off simultaneously. For example, assume that power supply to a component related to parking brake is done via the second power supply hub HB2, and power supply to a component related to foot brake is done via the fifth power supply hub HB5. In this case, the semiconductor relays RL are provided at least at positions where the power supply routes between the second power supply hub HB2 and the fifth power supply hub HB5 can be separated from each other. Specifically, the semiconductor relays RL are provided on any one of the main power feed lines ML2, ML1, ML4, and ML5 that are a clockwise power supply route from the second power supply hub HB2 as viewed in FIG. 2 (hereinafter this main power feed line is called a first power feed line) and on any one of the main power feed lines ML3, ML7, and ML6 that are a counterclockwise power supply route from the second power supply hub HB2 as viewed in FIG. 2 (hereinafter this main power feed line is called a second power feed line). The detectors 5 are placed at least between the semiconductor relay RL provided on the first power feed line and the semiconductor relay RL provided on the second power feed line. Specifically, the semiconductor relays RL are provided at least at two positions on the clockwise power supply route and the counterclockwise power supply route, as viewed from a detector 5 localized as the break point, so that the break point can be separated from the main power feed lines ML. Note that the example of FIG. 1 in this embodiment is configured so that a break point is separated from the main power feed lines ML and yet power is supplied to at least one of the components provided to secure redundancy. Specific details will be described later in operation explanation using FIG. 5.

The detection results from the detectors 51 to 57 are gathered in the central arithmetic unit 30. If a break occurs in the main power feed lines ML, the central arithmetic unit 30 localizes the break point in the main power feed lines ML based on the detection results from the detectors 51 to 57, as will be described later in detail. The method of localizing a break point by the central arithmetic unit 30 (the method of detecting a temporal change in current value) is not particularly limited. As an example, however, the central arithmetic unit 30 may observe the voltage waveforms of the detectors 5 and, referring to a database (not shown) of waveform changes stored in advance, localize the break point. Otherwise, localization of a break point may be implemented by a hardware circuit. For example, localization can be implemented by a circuit in which the measured current results of the detectors 5 are input into comparators configured to invert the output when the input exceeds a predetermined current value and one inverted earliest among the outputs of the comparators is flagged.

Further, once having localized the break point in the main power feed lines ML, the central arithmetic unit 30 cuts off the semiconductor relays RL located on both sides of the detector 5 that has detected the break in the main power feed lines ML. The method of cutting off the semiconductor relays RL by the central arithmetic unit 30 is not particularly limited. As an example, the semiconductor relays RL may be turned ON/OFF by the central arithmetic unit 30 by way of the controllers 49 of the power supply ICs 4 provided in the power supply hubs HB as shown in FIG. 2, or may be turned ON/OFF directly by the central arithmetic unit 30.

Also, as shown in FIG. 2, fuses F are provided on the power feed lines for shutting off power in the event of an overcurrent.

FIG. 3 shows more specifically the power supply topology of the left-side zones of the vehicle (the left front zone, the left side zone, and the left rear zone), i.e., the zones where the power supply hubs HB1 to HB3 are placed. Note that, in FIG. 3, smart actuators, among the electronic devices D, are shown by double lines. In FIG. 3, also, while signal lines are shown by thin lines, power feed lines are shown by bold lines.

The power supply hubs HB may also be used as hubs for formation of a communication network inside the vehicle 1. In the example of FIG. 3, a communication trunk line 62 connecting the central arithmetic unit 30 with the zone ECUs 20 is routed in a ring along the main power feed lines ML connecting the power supply hubs HB, to extend around the vehicle 1 as viewed in plan, thereby forming a trunk network. The power supply hubs HB are each provided with a power supply port (not shown) for connection to the main battery Bm and a communication port (not shown) for connection to the trunk network. The power supply port and the communication port may be provided separately, or a single port may serve as both the power supply port and the communication port. Although illustration of a specific configuration is omitted, FIG. 3 shows an example in which a single port is commonly used as the power supply port and the communication port, and connection to both the main power feed line ML and the communication trunk line 62 is possible by inserting a smart connector SC or a connector C provided at the tip of a cable extending from an electronic device D. The smart connector SC, in which an analog/digital conversion circuit and a driver circuit, for example, are embedded, has a function of sending a drive signal to an actuator as an electronic device D and a function of transmitting an input signal from a sensor as an electronic device D to the zone ECU 20.

Figure 4:
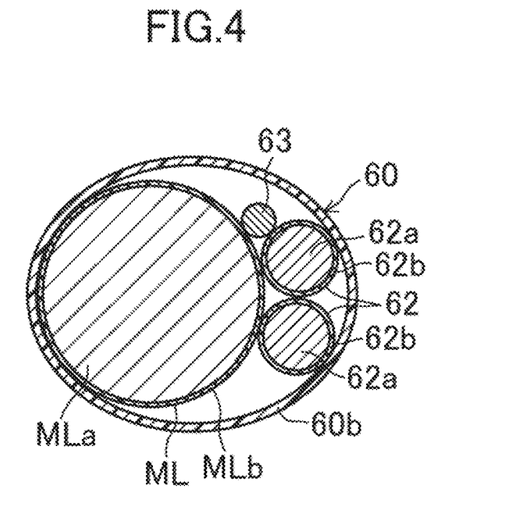
FIG. 4 is a cross-sectional view taken along line IV-IV in FIG. 3.

FIG. 4 is a cross-sectional view taken along line IV-IV in FIG. 3, showing an example of the cross-sectional structure of a trunk harness 60 connecting the power supply hubs HB. In this embodiment, it is assumed that the communication between the power supply hubs HB is performed under a serial communication system such as Ethernet (registered trademark).

As shown in FIG. 4, the trunk harness 60 is constituted by the main power feed line ML, the twisted communication trunk line 62, and a break detection wire 63. The break detection wire 63 is routed to extend along the main power feed lines ML as the power supply wires and configured to connect the power supply hubs HB placed adjacent to each other. For example, the break detection wire 63 is configured to connect the power supply hub HB0 and the first power supply hub HB1 along the main power feed line ML1. Likewise, the break detection wire 63 is configured to connect the first power supply hub HB1 and the second power supply hub HB2 along the main power feed line ML2. Also, the break detection wire 63 is configured to connect the second power supply hub HB2 and the third power supply hub HB3 along the main power feed line ML3. The break detection wire 63 is configured to connect the power supply hub HB0 and the fourth power supply hub HB4 along the main power feed line ML4. The break detection wire 63 is configured to connect the fourth power supply hub HB4 and the fifth power supply hub HB5 along the main power feed line ML5. The break detection wire 63 is configured to connect the fifth power supply hub HB5 and the sixth power supply hub HB6 along the main power feed line ML6. The break detection wire 63 is configured to connect the third power supply hub HB3 and the sixth power supply hub HB6 along the main power feed line ML7.

The break detection wire 63 is configured to detect damage to the power supply wires caused by an external force acting on the vehicle 1 by its own damage. The external force acting on the vehicle 1 may occur when the vehicle collides with an obstacle or another vehicle, for example.

Specifically, the trunk harness 60 is routed in forward and backward directions of the vehicle along a closed cross-sectional portion of a side sill on the bottom edge of a door opening of the vehicle body, and a grommet formed integrally with a tie-wrap tying the trunk harness 60 into a bundle is engaged with a small hole formed through the closed cross-sectional portion of the side sill, whereby the trunk harness 60 is locked.

If a lateral collision occurs on the vehicle, for example, the side sill will bend inward. With this deformation, the trunk harness 60 will be detached from the side sill due to tearing of the grommet, etc., but be kept tied at both ends where the lock to the vehicle body remains, resulting in being stretched anyway. At this time, although the possibility of the main power feed line ML being torn causing a break is small, the main power feed line ML may be pinched between parts of the vehicle body causing a break, or the vinyl coating may be broken causing the bare wire coming into contact with the vehicle body.

Since the break detection wire 63 with low strength is damaged itself due to the same external force causing a break before the main power feed line ML suffers such damage, it can detect the break position or a position where there is a possibility of a break more reliably. Also, since the break detection wire 63 is configured to connect the power supply hubs HB placed adjacent to each other, it can detect between which power supply hubs HB the break has occurred or there is a possibility of a break.

The break detection wire 63 may be formed to be more brittle than the main power feed line ML. For example, the break detection wire 63 is formed of a material more brittle than the main power feed line ML. Alternatively, the break detection wire 63 may be made brittle by using no coating material while cores MLa and 62a of the main power feed line ML and the communication trunk line 62 are covered with coating materials MLb and 62b, respectively. Otherwise, the break detection wire 63 may be formed to have a diameter smaller than the main power feed line ML. Thus, by making the break detection wire 63 more brittle than the main power feed line ML, the break detection wire 63 is more susceptible to cutting under an impact from outside. In this way, the position where the main power feed line ML has broken, or the position where there is a possibility of a break in the main power feed line ML, between the power supply hubs HB can be detected more reliably. The method of detecting a break in the break detection wire 63 is not particularly limited, but, for example, a faint current may be made to flow and be monitored. Otherwise, a break may be detected using a conventionally known physical means.

Figure 5:
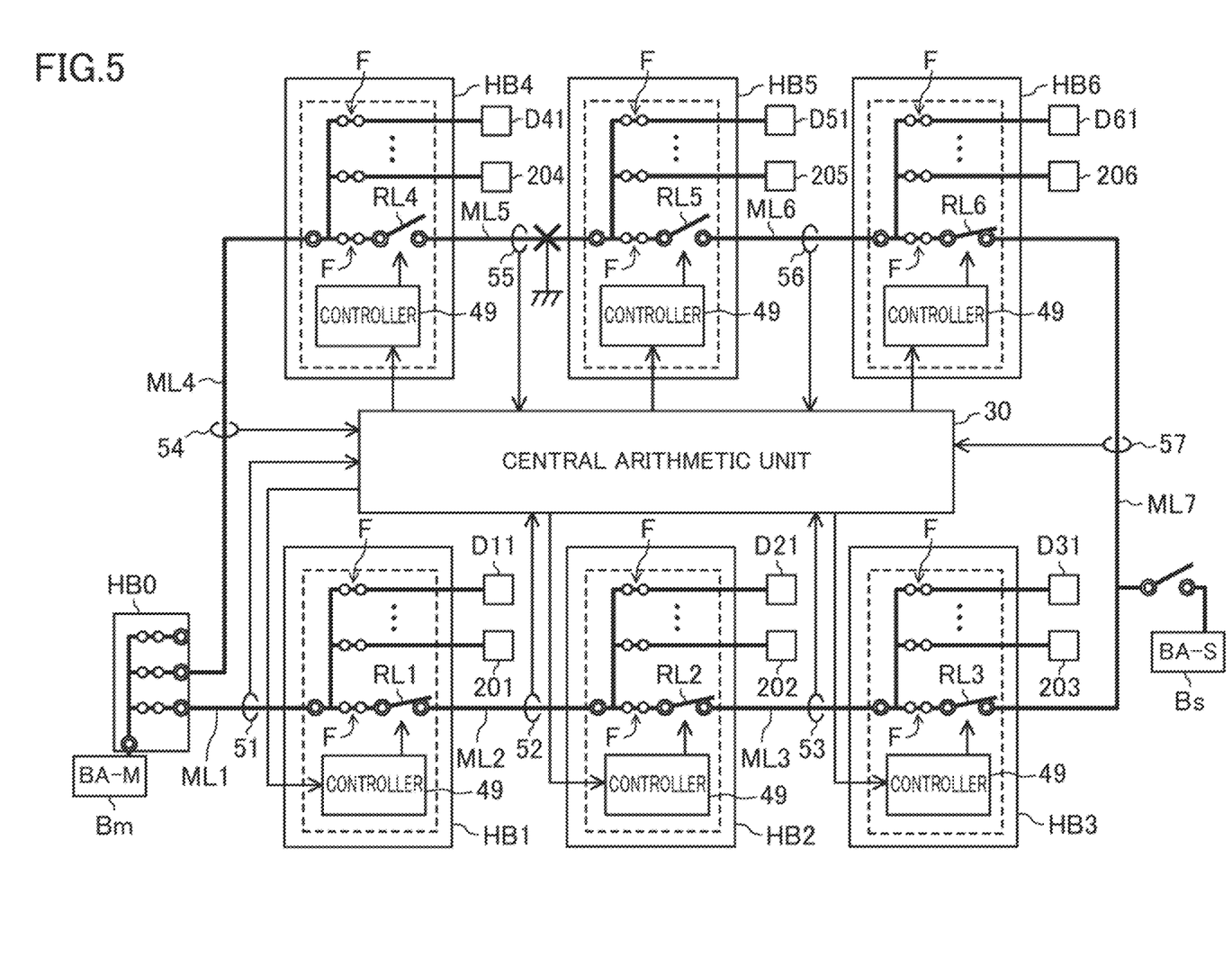
FIG. 5 is a view for explaining an operation performed when part of a ring-shaped power supply wire has broken.

Next, the operation performed when a portion of the main power feed lines ML (the ring-shaped power supply wire) has broken will be described. In this embodiment, as shown in FIG. 5, description will be made assuming that the main power feed line ML5 connecting the fourth power supply hub HB4 and the fifth power supply hub HB5 has broken and grounded. Assume also that the detectors 5 are ammeters.

When the main power feed line ML5 is grounded, the current values measured by all the detectors 5 sharply increase as the main power feed lines ML are connected in a ring. By this increase, the central arithmetic unit 30 detects that a break (grounding) has occurred in the main power feed lines ML. Further, in observation of the temporal changes in current, the currents at the detectors 5 sharply change sequentially starting from the detector closest to the break point. The central arithmetic unit 30, monitoring the temporal changes in current values at the detectors 5, for example, determines that a break has occurred near the detector 5 at which a sharp change in current value has occurred first (the detector 55 in the illustrated example).

Once localizing the break point in the main power feed lines ML as the vicinity of the detector 55, the central arithmetic unit 30 cuts off the semiconductor relays RL located on both sides of the break point. In the illustrated example, the central arithmetic unit 30 cuts off the semiconductor relay RL4 of the fourth power supply hub HB4 and the semiconductor relay RL5 of the fifth power supply hub HB5, which are the semiconductor relays RL located on both sides of the detector 55. With this, the main power feed line ML5 can be separated from the main power feed lines ML1 to ML4, ML6, and ML7 connected to the main battery Bm.

In FIG. 1, when the break point is somewhere in the main power feed line ML1 or ML4, the central arithmetic unit 30 cuts off the semiconductor relay RL1 of the first power supply hub HB1 and the semiconductor relay RL4 of the fourth power supply hub HB4. With this, no power will be supplied from the main battery Bm to the main power feed lines ML2, ML3, and ML5 to ML7. The central arithmetic unit 30 therefore turns ON the relay RL7 provided between the spare battery Bs and the main power feed line ML7, so that power is supplied to the main power feed lines ML2, ML3, and ML5 to ML7 from the spare battery Bs.

In the case of mounting a plurality of electronic devices D in the vehicle 1 as in Embodiment 1, the main battery Bm and the electronic devices D were conventionally connected through a plurality of wires and relays. Therefore, conventionally, as the number of electronic devices D increased, the power system of the vehicle became more complicated.

In contrast to the above, according to Embodiment 1, the vehicle is divided into a plurality of zones, each of which is provided with the power supply hub HB for connecting electronic devices, and the main battery Bm and the power supply hubs HB are connected through the ring-shaped main power feed line ML. With this, the configuration of the power system can be simplified. Further, in comparison with the case of directly connecting the main battery Bm with the electronic devices D, the power feed lines can be shortened, whereby power consumption due to the electric resistance of the power feed lines can be made as small as possible.

Moreover, the break detection wire 63 is provided along the main power feed lines ML placed in a ring. It is not easy to localize a break position using fuses in the case of the main power feed lines placed in a ring. However, using the configuration of this embodiment, a break point or a point having a possibility of a break can be detected more reliably even in the case of main power feed lines placed in a ring.

In summary, having the configuration of this embodiment, power supply from the main battery can be continued for the main power feed lines ML other than the disconnected portion. That is, as described above, it is possible to simplify the configuration of the power system by placing the main power feed lines ML in a ring, thereby drastically shortening the total power route length. Also, by providing the break detection wire 63, the break position can be detected more reliably. It is therefore possible to achieve both drastic shortening of the total power route length and measures against a break in the main power feed lines ML.

Embodiment 2

Embodiment 2 will be described hereinafter in detail with reference to the relevant drawing. Note that components in common with Embodiment 1 will be denoted by the same reference characters, and detailed description of such components will be omitted.

Figure 6:
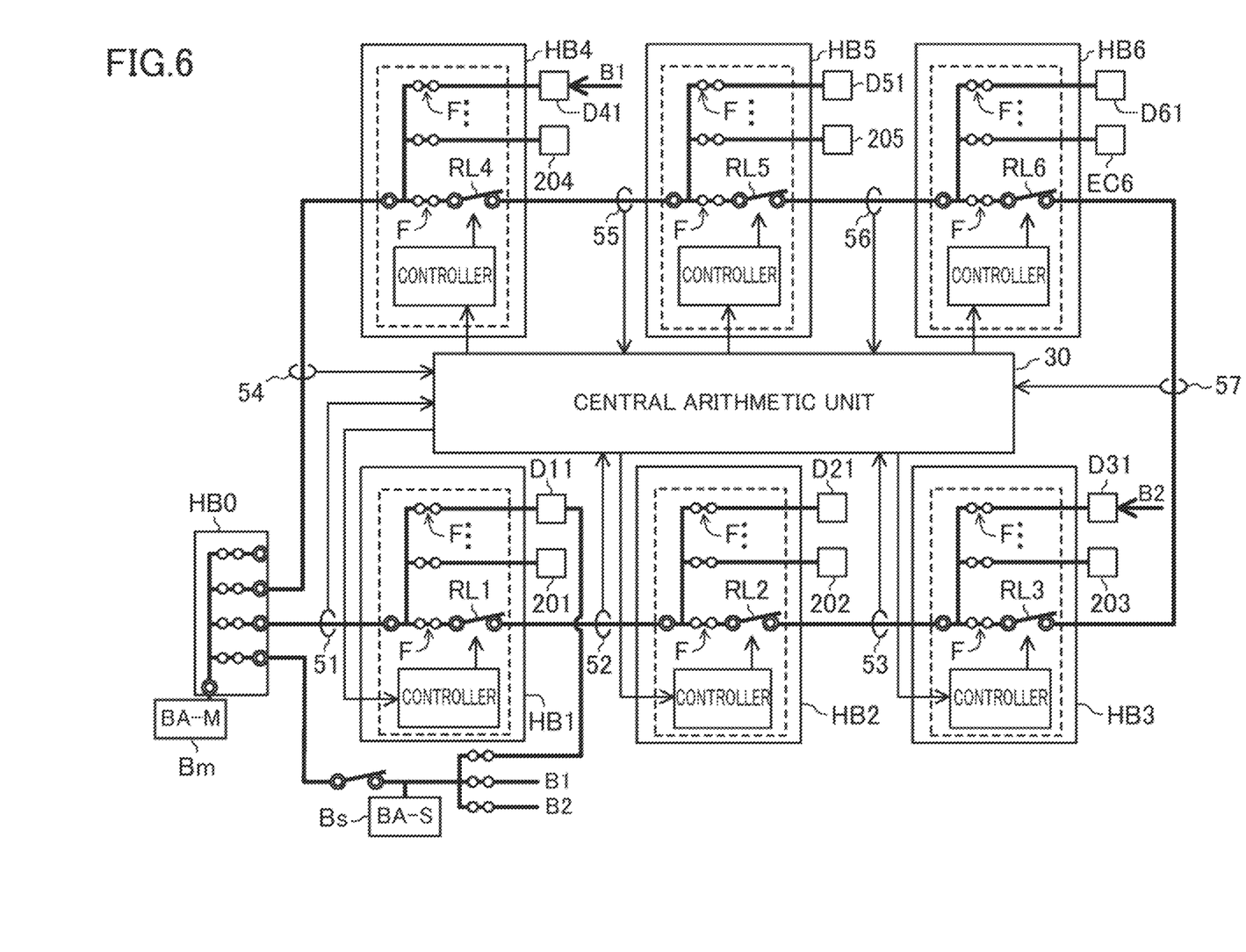
FIG. 6 is a block diagram showing another example of power supply topology for a vehicle.

In an in-vehicle network according to Embodiment 2, the method of supplying power from the spare battery Bs is different from that in Embodiment 1. Specifically, as shown in FIG. 6, the in-vehicle network according to Embodiment 2 is different from Embodiment 1 in that power can be supplied individually from the spare battery Bs for components provided to secure redundancy. This makes it possible to avoid an occurrence of simultaneous stop of power supply to the components provided to secure redundancy. In the example of FIG. 6, the spare battery Bs is connected to the head lights D1/ and D41 and the brake light D31. Therefore, even if a break occurs on a portion of the main power supply lines ML causing an emergency stop at night, it is possible to warn the surrounding vehicles of the stop.

While the technology disclosed herein has been described in terms of the embodiments described above, it is to be understood that various changes and alterations may be made without departing from the spirit of the appended claims. It is also to be understood that the embodiments described above are mere illustrations and the scope of the present disclosure should not be construed restrictively. The scope of the present disclosure is defined by the appended claims, and alterations and changes that fall within equivalent bounds of the claims are all within the scope of the present disclosure.

INDUSTRIAL APPLICABILITY

The technology disclosed herein is useful as an in-vehicle network system for a vehicle having a plurality of electronic devices actuated with power supplied from a battery.

The invention claimed is:

1. An in-vehicle power supply structure in which a vehicle is divided into a plurality of zones, a power supply hub for connecting an electronic device is provided in each of the zones, and the power supply hubs are connected through power supply wires, to form a ring-shaped power supply route, the power supply hubs including two first power supply hubs adjacent to each other; and two second power supply hubs adjacent to each other at positions apart from the two first power supply hubs, the structure comprising:
  a main battery connected to a power supply wire that connects the two first power supply hubs to each other in the ring-shaped power supply route;
  an auxiliary battery connected to a power supply wire that connects the two second power supply hubs to each other in the ring-shaped power supply route; and
  a break detection wire routed along the power supply wires, for detecting damage to the power supply wires caused by an external force acting on the vehicle by its own damage,
  wherein
    the break detection wire is configured to connect the power supply hubs placed adjacent to each other,
    each of the power supply hubs includes a relay configured to perform connection/disconnection the ring-shaped power supply route, and
    the in-vehicle power supply structure is configured so that, in response to a detected break of the break detection wire, the relays of the power supply hubs placed on both sides of and adjacent to a position of the detected break are both disconnected.

2. The in-vehicle power supply structure of claim 1, further comprising:
  an auxiliary relay between the auxiliary battery and the power supply wire connecting the two second power supply hubs to each other, the auxiliary relay being configured to be connected in response to detection of a break of the break detection wire between the two first power supply hubs, to allow power supply from the auxiliary battery to the ring-shaped power supply route.

3. The in-vehicle power supply structure of claim 1, wherein
  the break detection wire is more brittle than the power supply wires.

* * * * *